United States Patent
Sahota et al.

(10) Patent No.: US 8,019,310 B2
(45) Date of Patent: *Sep. 13, 2011

(54) LOCAL OSCILLATOR BUFFER AND MIXER HAVING ADJUSTABLE SIZE

(75) Inventors: Gurkanwal Singh Sahota, San Diego, CA (US); Frederic Bossu, San Diego, CA (US); Ojas M. Choksi, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 728 days.

This patent is subject to a terminal disclaimer.

(21) Appl. No.: 11/955,201

(22) Filed: Dec. 12, 2007

(65) Prior Publication Data

US 2009/0111414 A1    Apr. 30, 2009

Related U.S. Application Data

(60) Provisional application No. 60/983,879, filed on Oct. 30, 2007.

(51) Int. Cl.
*H04B 1/26* (2006.01)
*H04B 7/00* (2006.01)
*H04B 15/00* (2006.01)

(52) U.S. Cl. .................. 455/313; 455/196.1; 455/255; 455/318; 455/323

(58) Field of Classification Search ............ 455/76, 455/147, 148, 196.1, 255–265, 313–319, 455/323–326, 333, 141

See application file for complete search history.

(56) References Cited

U.S. PATENT DOCUMENTS

| | | | |
|---|---|---|---|
| 3,212,024 A | 10/1965 | King, Jr. | |
| 5,930,696 A * | 7/1999 | Tzuang et al. | 455/311 |
| 5,966,666 A | 10/1999 | Yamaguchi et al. | |
| 6,016,422 A | 1/2000 | Bartusiak | |
| 6,259,301 B1 | 7/2001 | Gailus et al. | |
| 6,307,894 B2 | 10/2001 | Eidson et al. | |
| 6,487,398 B1 | 11/2002 | Nobbe et al. | |
| 6,590,438 B1 | 7/2003 | Manku et al. | |
| 6,906,996 B2 | 6/2005 | Ballantyne | |
| 6,985,033 B1 | 1/2006 | Shirali et al. | |
| 7,023,275 B2 | 4/2006 | Miyamoto | |
| 7,076,231 B2 | 7/2006 | Yamawaki et al. | |

(Continued)

FOREIGN PATENT DOCUMENTS

EP    0276130 A2    7/1988

(Continued)

OTHER PUBLICATIONS

Bagheri, Rahim, "An 800-MHz-6-GHz Software-Defined Wireless Receiver in 90-nm CMOS," IEEE Journal of Solid-state Circuits, vol. 41, No. 12, Dec. 2006.

(Continued)

*Primary Examiner* — Simon D Nguyen
(74) *Attorney, Agent, or Firm* — Larry Moskowitz

(57) ABSTRACT

Selectable sizes for a local oscillator (LO) buffer and mixer are disclosed. In an embodiment, LO buffer and/or mixer size may be increased when a receiver operates in a high gain mode, while LO buffer and/or mixer size may be decreased when the receiver operates in a low gain mode. In an embodiment, LO buffer and mixer sizes are increased and decreased in lock step. Circuit topologies and control schemes for specific embodiments of LO buffers and mixers having adjustable size are disclosed.

32 Claims, 7 Drawing Sheets

U.S. PATENT DOCUMENTS

| | | | |
|---|---|---|---|
| 7,092,676 | B2 | 8/2006 | Abdelgany et al. |
| 7,139,547 | B2 * | 11/2006 | Wakayama et al. ............ 455/333 |
| 7,151,919 | B2 * | 12/2006 | Takalo et al. ................. 455/323 |
| 7,277,689 | B2 | 10/2007 | Simon |
| 7,280,805 | B2 | 10/2007 | Xu et al. |
| 7,457,605 | B2 | 11/2008 | Thompson et al. |
| 7,460,844 | B2 | 12/2008 | Molnar et al. |
| 7,468,629 | B2 | 12/2008 | Chien |
| 7,702,359 | B2 | 4/2010 | Tanaka et al. |
| 7,729,681 | B2 | 6/2010 | Someya |
| 7,778,613 | B2 * | 8/2010 | Seendripu et al. ............ 455/130 |
| 2004/0127172 | A1 * | 7/2004 | Gierkink et al. ................ 455/91 |
| 2005/0107055 | A1 * | 5/2005 | Bult et al. .................. 455/234.1 |
| 2005/0282512 | A1 * | 12/2005 | Yu ................................ 455/260 |
| 2006/0068746 | A1 * | 3/2006 | Feng et al. .................... 455/323 |
| 2006/0246862 | A1 | 11/2006 | Agarwal et al. |
| 2007/0247212 | A1 | 10/2007 | Zhang |
| 2007/0298750 | A1 * | 12/2007 | Masuda ........................ 455/323 |
| 2008/0125060 | A1 | 5/2008 | Lin et al. |
| 2009/0023413 | A1 * | 1/2009 | Xu et al. ....................... 455/319 |
| 2009/0239592 | A1 | 9/2009 | Deng et al. |
| 2009/0252252 | A1 | 10/2009 | Kim et al. |
| 2010/0029323 | A1 | 2/2010 | Tasic et al. |

FOREIGN PATENT DOCUMENTS

| | | | |
|---|---|---|---|
| EP | 1521376 | A1 | 4/2005 |
| EP | 1760877 | A1 | 3/2007 |
| EP | 1833161 | A1 | 9/2007 |
| JP | 2005184608 | A | 7/2005 |
| KR | 19990081842 | | 11/1999 |
| WO | WO9726710 | | 7/1997 |
| WO | WO2006002945 | | 1/2006 |
| WO | WO2006117589 | | 11/2006 |
| WO | WO2007053365 | A1 | 5/2007 |
| WO | WO2008008759 | | 1/2008 |

OTHER PUBLICATIONS

Brenna G et al: "A 2GHz Carrier Leakage Calibrated Direct-Conversion WCDMA Transmitter in 0.13-<tex>$muhboxm$,/tex.CMOS" IEEE Hournal of Solid-State Circuits, IEEE vol. 39, No. 8, Aug. 1, 2004, pp. 1253-1262, XP011115212.
Circa R et al: "Resistive MOSFET mixer for mobile direct conversion receivers" Microwave and Optoelectronics Conference, 2003. IMOC 2003. Proceedings of the 2003 SBMO/IEEE MTT-S International Sep. 20-23, 2003, Piscataway, NJ, USA,IEEE, US, vol. 3, Sep. 20, 2003, pp. 59-64, XP010687639 ISBN: 978-0-7803-7824-7 the whole document.
Farbod Behbahani et al: "A 2.4-GHz Low-IF Receiver for Wideband WLAN in 0.6-m CMOS-Architecture and Front-End" IEEE Journal of Solid-State Circuits, IEEE Service Center, Piscataway, NJ, US, vol. 35, No. 12, pp. 1908-19161 Dec. 1, 2000, XP011061384 ISSN: 0018-9200 section IV B figure 8a.
International Search Report and Written Opinion—PCT/US2008/076325, International Search Authority—European Patent Office—Jan. 13, 2009.
Kim, Bonkee et al: "A 2.6 V GSM/PCN Dual Band Variable Gain Low Noise RF Down Conversion Mixer" 2002 IEEE Radio Frequency Integrated Circuits Symposium, 2002, pp. 137-140, XP002508867 sections II and III figures 1-3.
Kim,K et al.: "A resistively degenerated wide-band passive mixer with low niose figure and +60dBm IIP2 in 0.18 1/4 m CMOS" Radio Frequency Integrated Circuits Symposium, 2008. RFIC 2008, IEEE Piscataway, NJ, US, Jun. 17, 2008, pp. 185-188. ISBN: 978-1-4244-1808-4.
Mayer C et al: "A Robust GSM/EDGE Transmitter Using Polar Modulation Techniques" Wireless Technology, 2005. The European Conference on CNIT LA Defense, Paris Oct. 3-4, 2005, Piscataway, NJ, USA,IEEE LNKDDOI: 10.1109/ECWT.2005.1617663, Oct. 3, 2005, pp. 103-106, XP010908871 ISBN: 978-2-9600551-1-5 figure 2.
McCune E Ed—Maxim A: "Polar modulation and bipolar RF power devices" Bipolar/BICMOS Circuits and Technology Meeting, 2005. Proceedings of the, IEEE, Piscataway, NJ, USA LNKDDOI: 10.1109/BIPOL.2005.1555188, Oct. 9, 2005, pp. 1-5, XP010861821 ISBN: 978-0-7803-9309-7 figure 2.
Nguyen et al., "A Low-Power RF Direct-Conversion Receiver/Transmitter for 2.4-GHz-Band IEEE 802.15.4 Standard in 0.18-.mu.m CMOS Technology," vol. 54, No. 12, Dec. 2006, pp. 4062-4071.
Razavi B et al: "Multiband UWB transceivers" Custom Integrated Circuits Conference, 2005. Proceedings of the IEEE 2005, IEEE, Piscataway, NJ, USA, Sep. 18, 2005, pp. 140-147, XP010873764 ISBN: 978-0-7803-9023-2 the whole document.
Translation of Office Action in Japan application 2010-525056 corresponding to U.S. Appl. No. 11/855,997, citing WO2007053365A1 and JP2005184608 dated Feb. 22, 2011.
Translation of Office Action in Korean application 10-2010-7008070 corresponding to U.S. Appl. No. 12/209,164, citing WO2007053365 and KR19990081842 dated Apr. 29, 2011.
Translation of Office Action in Korean application 2010-7008071 corresponding to U.S. Appl. No. 12/209,164,, citing KR19990081842 and Kim_Bonkee_et_al_A_2_6_V_GSM_PCN_year_2002 dated Apr. 29, 2011.
Translation of Office Action in Korean application 2010-7011862 corresponding to U.S. Appl. No. 11/955,201, citing KR19990081842 and Kim_Bonkee_et_al_A_2_6_V_GSM_PCN_year_2002 dated Apr. 29, 2011.
Wan, Jiansong, "Tunable Bandpass (1 .7-6)GHz Polyphase Filter in Near Zero IF Receiver,"Philips, Jul. 2007.
Zhu, Yide, "Harmonic Rejection Mixer for Digital Video Broadcase-Handheld," Thesis, Delft University of Technology, Jun. 2007.
Ziv R et al: "A phase correction technique applied to 700MHz a 6GHz complex demodulators in multi-band wireless systems" Microwaves, Communications, Antennas and Electronic Systems, 2008. COmcas 2008. IEEE International Conference on, IEEE, Piscataway, NJ, USA, May 13, 2008, pp. 1-8, XP031285366 ISBN: 978-1-4244-2097-1.

* cited by examiner

LOCAL OSCILLATOR BUFFER AND MIXER HAVING ADJUSTABLE SIZE

PRIORITY

This application claims benefit of U.S. Provisional Application No. 60/983,879 titled "LOCAL OSCILLATOR BUFFER AND MIXER HAVING ADJUSTABLE SIZE," filed Oct. 30, 2007, the entire disclosure of this application being considered part of the disclosure of this application.

RELATED APPLICATIONS

The present application is related to U.S. patent application Ser. No. 11/855,997, entitled "Mixer with high output power accuracy and low local oscillator leakage," filed on Sep. 14, 2007, assigned to the assignee of the present application, the contents of which are hereby incorporated by reference in their entirety.

TECHNICAL FIELD

The disclosure relates to communications receivers and, more particularly, to techniques for adjusting the size of local oscillator buffers and mixers.

BACKGROUND

In a communication system, a receiver receives a radio-frequency (RF) signal from a transmitter, and downconverts the received signal from RF to baseband using one or more mixers. Each mixer mixes the received signal with a local oscillator (LO) signal. An LO buffer is typically provided to buffer the LO signal before the mixer.

In the receiver signal path, the optimal sizes for the mixer and the LO buffer depend partially on the linearity requirements of the receiver. A larger mixer size tends to improve receiver linearity, while a smaller mixer size reduces power consumption. Employing a larger mixer size usually mandates a correspondingly larger LO buffer, as the size of the mixer directly determines the load on the LO buffer.

In conventional receivers, the sizes of the LO buffer and the mixers are fixed. It would be desirable to dynamically adjust the size of the LO buffer and/or mixers depending on the requirements of the receiver.

SUMMARY

An aspect of the present disclosure provides a receiver apparatus comprising a local oscillator (LO) buffer operative to buffer an LO signal to produce a buffered LO signal, the LO buffer having a selectable size.

Another aspect of the present disclosure provides a method for selecting a size of at least one component in a receiver, the receiver comprising an amplifier, a mixer, and a local oscillator (LO) buffer, the method comprising: selecting a first mixer size when the amplifier is in a first gain mode; and selecting a second mixer size when the amplifier is in a second gain mode, the gain of the amplifier higher in the second gain mode than in the first gain mode, and the second mixer size larger than the first mixer size.

Yet another aspect of the present disclosure provides a receiver apparatus comprising means for providing a mixer having a selectable size; means for providing a local oscillator (LO) buffer having a selectable size; and means for selecting a first mixer size and a first local oscillator (LO) buffer size when the receiver is in a first gain mode, and for selecting a second mixer size and a second local oscillator (LO) buffer size when the receiver is in a second gain mode.

DETAILED DESCRIPTION

In accordance with the present disclosure, techniques are disclosed for dynamically adjusting the sizes of the LO buffer and/or mixer depending on the requirements of the receiver.

Figure 1:
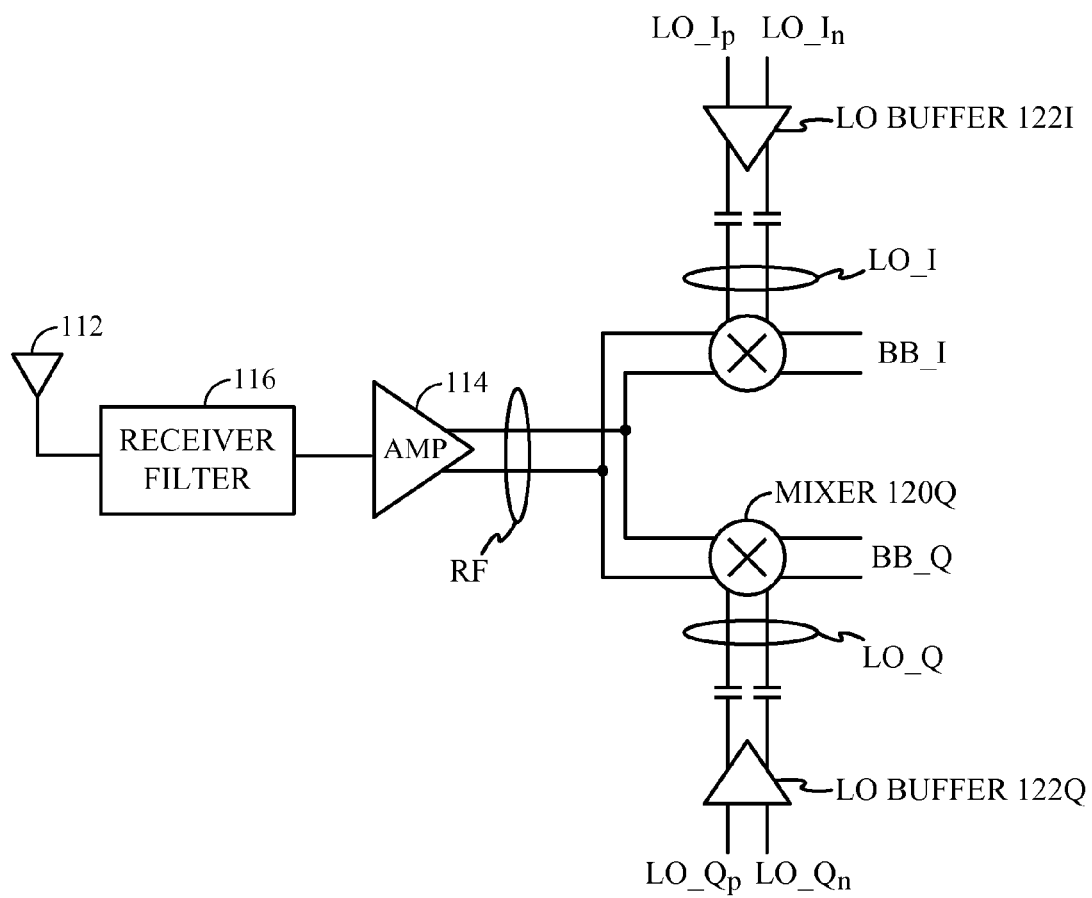
FIG. 1 depicts a portion of a receiver unit 100 known in the prior art.

FIG. 1 depicts a portion of a receiver unit 100 known in the prior art. Receiver unit 100 may be implemented within a terminal or a base station of a wireless (e.g., CDMA) communication system. Note other RF receiver designs may also be used and are within the scope of the present disclosure.

In FIG. 1, one or more RF modulated signals transmitted from one or more transmitters (e.g., base stations, GPS satellites, broadcast stations, and so on) are received by an antenna 112 and provided to a receiver filter 116. The filtered signal is then provided to an amplifier (Amp) 114. Amplifier 114 amplifies the received signal with a particular gain to provide an amplified RF signal. Amplifier 114 may include one or more low noise amplifier (LNA) stages designed to provide a particular range of gains and/or attenuation. The amplified RF signal is provided to mixers 120I and 120Q. Note the output of the amplifier 114 may be a differential signal, as shown in FIG. 1.

Mixers 120I and 120Q perform quadrature downconversion of the filtered RF signal from RF to baseband (BB). This may be achieved by multiplying (or mixing) the filtered RF signal with a complex local oscillator (LO) signal to provide a complex baseband signal. In particular, the filtered RF signal may be mixed with an inphase LO signal LO_I by mixer 120I to provide an inphase (I) baseband component BB_I. The filtered RF signal may also be mixed with a quadrature-phase LO signal LO_Q by mixer 120Q to provide a quadrature (Q) baseband component BB_Q. BB_I and BB_Q may be subsequently processed by additional blocks (not shown), e.g., a channel filter, a variable gain amplifier (VGA), and/or an analog-to-digital converter (ADC).

Note while this specification may refer to embodiments wherein the RF signal is directly mixed to baseband, embodiments wherein the RF signal is mixed to a non-zero intermediate frequency (IF) are also within the scope of the disclosure.

In FIG. 1, LO_I is provided to mixer 120I via an LO buffer 122I, whose input is a differential signal LO_Ip-LO_In. Similarly, LO_Q is provided to mixer 120Q via an LO buffer 122Q, whose input is a differential signal LO_Qp-LO_Qn. In a conventional receiver, the size of the mixers 120I and 120Q, and the size of the LO buffers 122I and 122Q, are fixed. Note in this specification and in the claims, the "size" of a buffer or a mixer may be understood to encompass the width of any or all transistors in the signal path of such a buffer or mixer.

According to the present disclosure, techniques are provided for adjusting the size of the mixer and/or LO buffer, and for dynamically configuring the sizes based on the receiver requirements.

Figure 2:
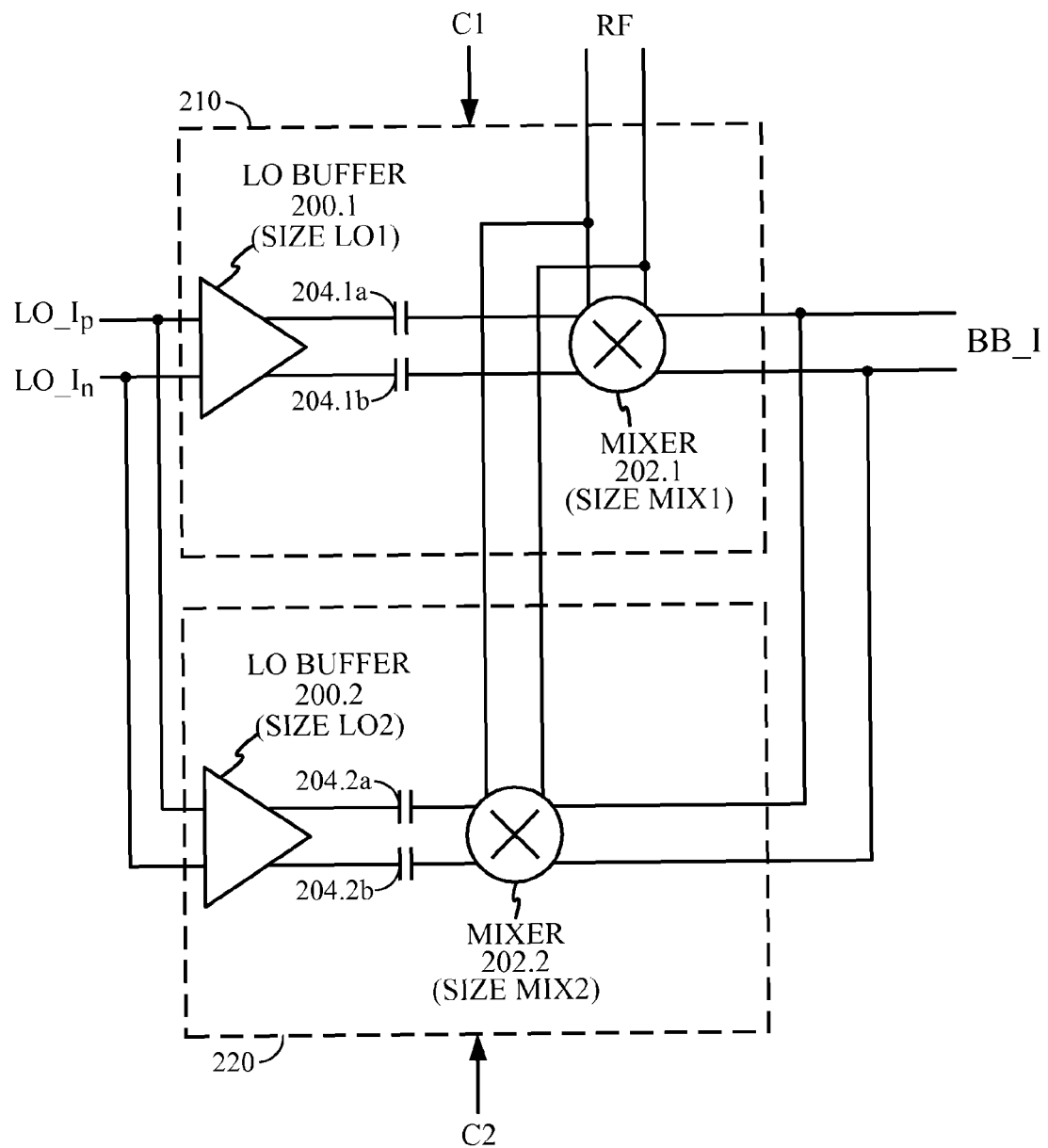
FIG. 2 shows an embodiment of an in-phase LO buffer and mixer according to the present disclosure.

FIG. 2 shows an embodiment of an in-phase LO buffer and mixer according to the present disclosure. One of ordinary skill in the art will realize that the techniques described may be directly applied to a quadrature-phase buffer and mixer. In the embodiment shown, the mixer has a current output. One of ordinary skill in the art may readily modify FIG. 2 to accommodate mixers having voltage outputs.

In FIG. 2, a differential LO signal LO_Ip-LO_In is provided to an LO buffer 200.1 of size LO1. The output of buffer 200.1 is coupled to the input of a mixer 202.1 of size MIX1 via coupling capacitors 204.1a and 204.1b. The signal path associated with buffer 200.1, mixer 202.1, and capacitors 204.1a and 204.1b (collectively labeled 210) may be referred to as the first signal path.

Similarly, the differential LO signal LO_Ip-LO_In is also provided to an LO buffer 200.2 of size LO2, whose output is coupled to the input of a mixer 202.2 of size MIX2 via coupling capacitors 204.2a and 204.2b. The signal path associated with buffer 200.2, mixer 202.2, and capacitors 204.2a and 204.2b (collectively labeled 220) may be referred to as the second signal path.

In FIG. 2, control signals C1 and C2 selectively enable or disable the first and second signal path, respectively. In an embodiment, this may be done by turning on or off the LO buffer and/or the mixer in the signal path, or by opening or closing a switch (not shown) placed in series with each signal path. One of ordinary skill in the art will recognize that a signal path may be selectively enabled or disabled using a variety of techniques not explicitly described herein. Such embodiments are contemplated to be within the scope of the present disclosure.

In an embodiment, the effective size of the LO buffer and mixer can be configured by selectively enabling the first, second, or both signal paths.

In particular, if the first signal path is enabled, and the second signal path is disabled, then the effective LO buffer size is LO1, and the effective mixer size is MIX1. Conversely, if the first signal path is disabled, and the second signal path is enabled, then the LO buffer size is LO2, and the mixer size is MIX2. Both signal paths may also be simultaneously enabled.

In a specific embodiment, LO2 is twice the value of LO1, and MIX2 is twice the value of MIX1. In this case, by setting control signals C1 and C2, the effective LO buffer/mixer size can be selected from a first size (first path enabled), a second size twice the first size (second path enabled), and a third size three times the first size (both paths enabled).

Note that in general, the sizes LO2, LO1, MIX2, and MIX1 may be arbitrarily chosen to have any relationship with each other. Any combination of sizes is contemplated to be within the scope of the present disclosure.

One of ordinary skill in the art will realize that the embodiment shown in FIG. 2 may be readily modified to accommodate more than two signal paths, providing even greater choice in the range of configurable buffer and mixer sizes. Such alternative embodiments are also contemplated to be within the scope of the present disclosure.

Figure 3:
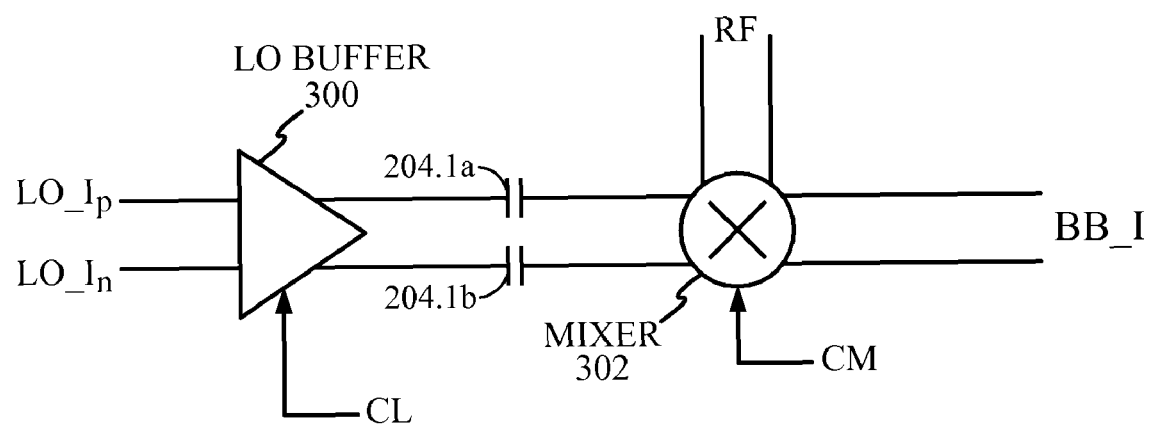
FIG. 3 depicts an alternative embodiment of the present disclosure, wherein the sizes of the LO buffer and mixer are made separately configurable.

FIG. 3 depicts an alternative embodiment of the present disclosure, wherein the sizes of the LO buffer and mixer are made separately configurable. In FIG. 3, a control signal CL selects a size of the LO buffer 300. Similarly, a control signal CM selects a size of the mixer 302. Note CL and CM may each comprise a plurality of sub-signals, depending on the number of sizes that are selectable within each block.

Figure 4:
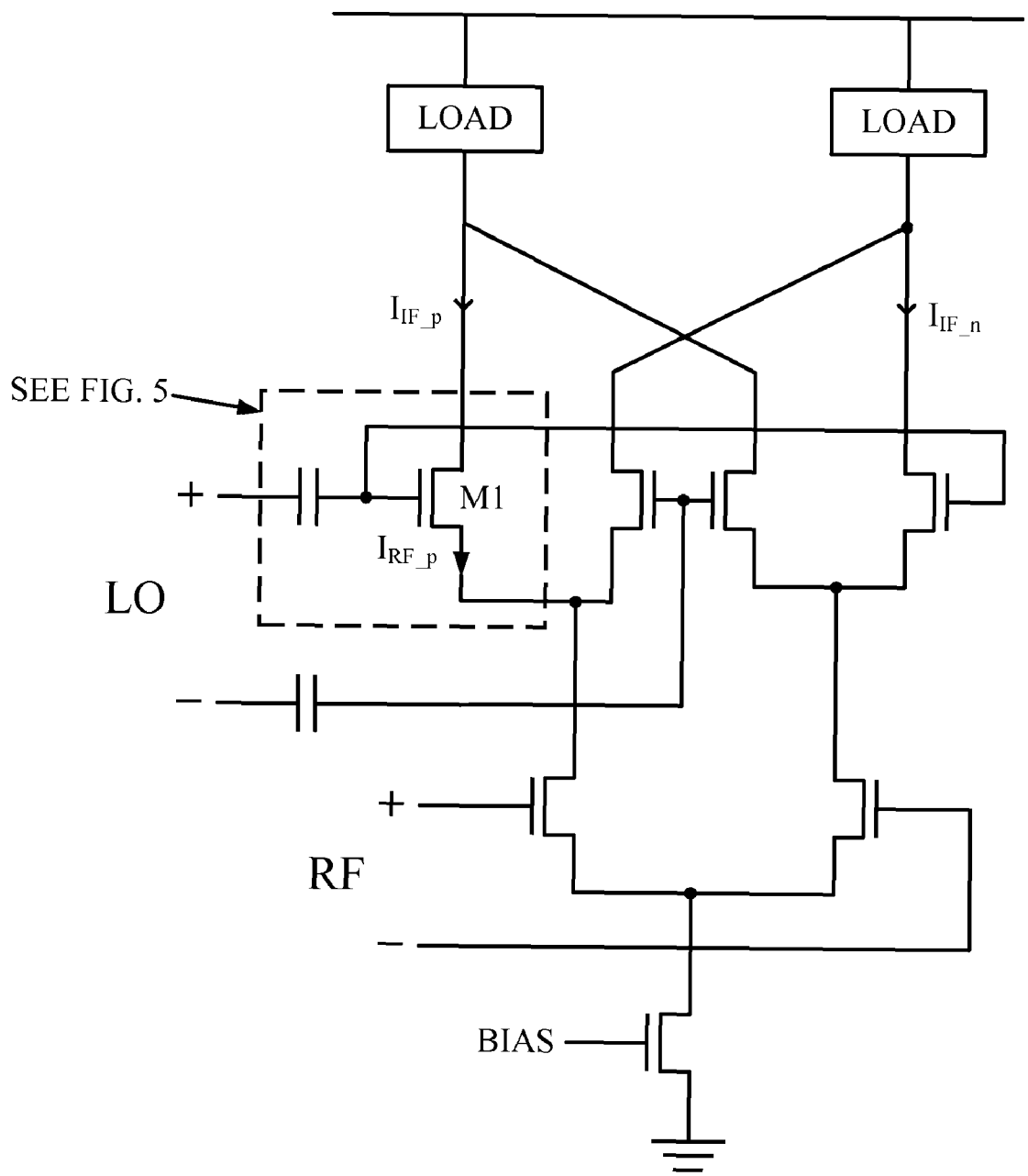
FIG. 4 depicts a conventional Gilbert multiplier architecture.
Figure 5:
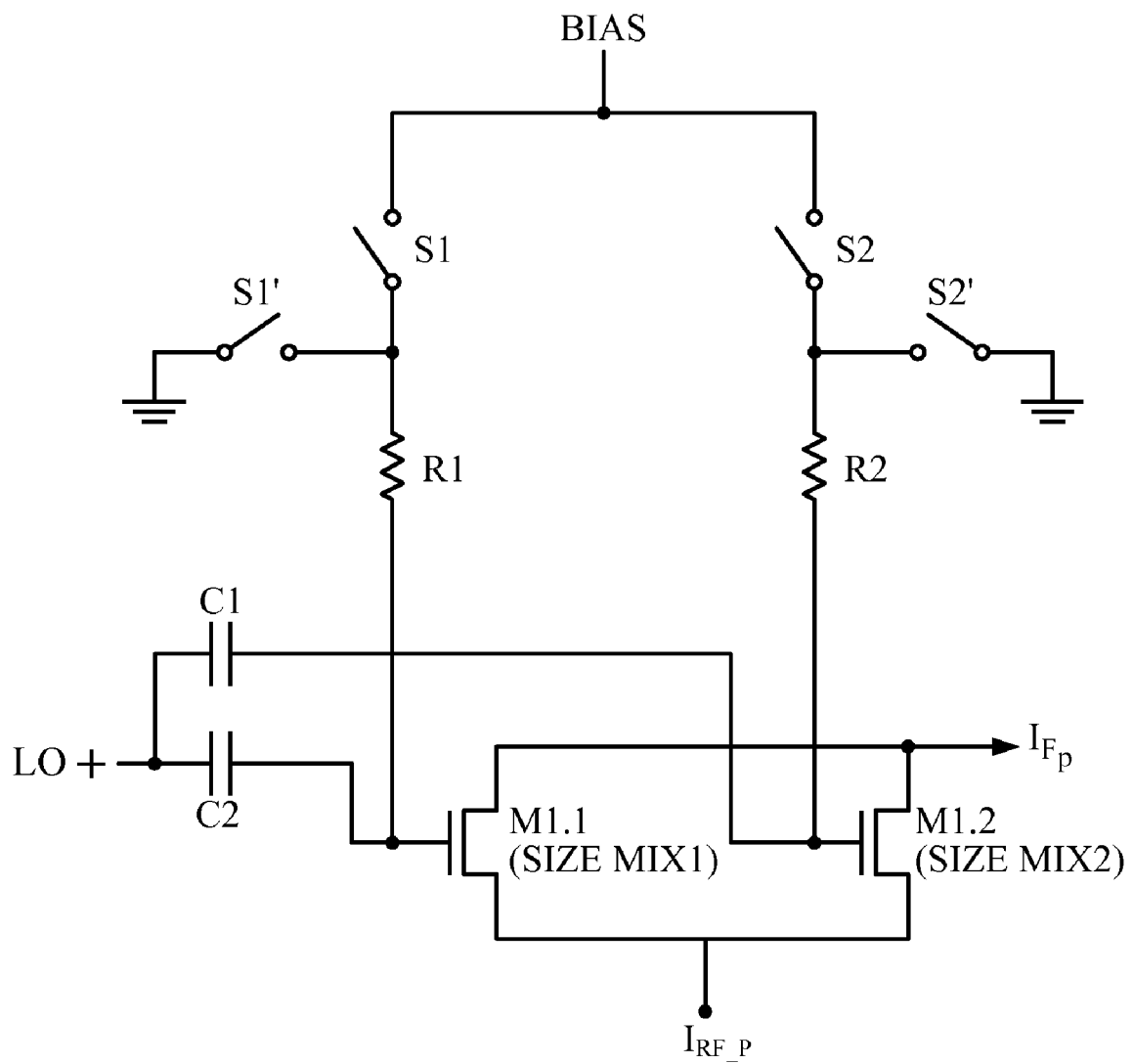
FIG. 5 depicts a detailed view of a circuit topology by which the size of one of the transistors, M1, coupled to the signal LO(+) in FIG. 4, is made adjustable according to the present disclosure.

In an embodiment, a mixer having adjustable sizes may be implemented by modifying a conventional Gilbert multiplier architecture using the techniques described herein with reference to FIGS. 4 and 5.

FIG. 4 depicts a conventional Gilbert multiplier architecture. In FIG. 4, a RF signal (RF) is multiplied to a local oscillator signal (LO) to generate a differential output current $I_{IF\_p}-I_{IF\_n}$. The operation of Gilbert multipliers is well known in the art, and will not be described further herein. Note FIG. 4 does not show the gate biasing arrangement for the transistors of the Gilbert multiplier.

According to the present disclosure, the size of the transistors coupled to the LO in FIG. 4 may be made adjustable according to the embodiment of FIG. 5.

FIG. 5 depicts a detailed view of a circuit topology by which the size of one of the transistors, M1, coupled to the signal LO(+) in FIG. 4, is made adjustable according to the present disclosure. One of ordinary skill in the art may readily apply the techniques depicted in FIG. 5 to make the size of the other transistors in FIG. 4 adjustable. Such embodiments are contemplated to be within the scope of the present disclosure.

In FIG. 5, transistor M1 is replaced by two transistors M1.1 and M1.2 having sizes MIX1 and MIX2, respectively. Transistors M1.1 and M1.2 are each coupled by a coupling capacitor C1 or C2 to the positive output of the LO buffer, LO(+). M1.1 and M1.2 are also coupled via bias resistance R1 or R2 to either ground or a bias voltage Vbias via switches S1/S1' and S2/S2'. According to the present disclosure, switch S1 is closed when S1' is open, and vice versa, and similarly for switches S2/S2'. The state of the switches may be controlled by the control signal CM provided to the mixer, as shown in FIG. 3.

The operation of the circuit shown in FIG. 5 may be characterized as follows. When S1 is closed and S2 is open, M1.1 is turned on, and M1.2 is turned off. This is because the gate of M1.1 is coupled to Vbias, while the gate of M1.2 is coupled to ground. In this case, the effective size of the transistor M1 as presented to the positive output of the LO buffer LO(+) is MIX1. Similarly, when S2 is closed and S1 is open, M1.2 is turned on, and M1.1 is turned off. In this case, the effective size of the transistor M1 is MIX2. Finally, when S1 and S2 are both closed, then both M1.1 and M1.2 are turned on. In this case, the effective size of the transistor M1 is MIX1+MIX2.

In an embodiment, the size MIX2 can be twice as large as MIX1. In this case, the size of transistor M1 is selectable effectively among MIX1, 2*MIX1, and 3*MIX1, by configuring the switches S1 and S2 as described above. Note in general, the values of MIX2 and MIX1 can have any relationship with each other.

One of ordinary skill in the art may readily modify the design depicted in FIG. 5 to accommodate more than the two transistors shown, to allow for further configurability using more selectable sizes. Note the control signal provided to the switches, e.g., CM according to FIG. 3, may be readily modified to accommodate more than two switches. Such embodiments are contemplated to be within the scope of the disclosure.

Figure 6:
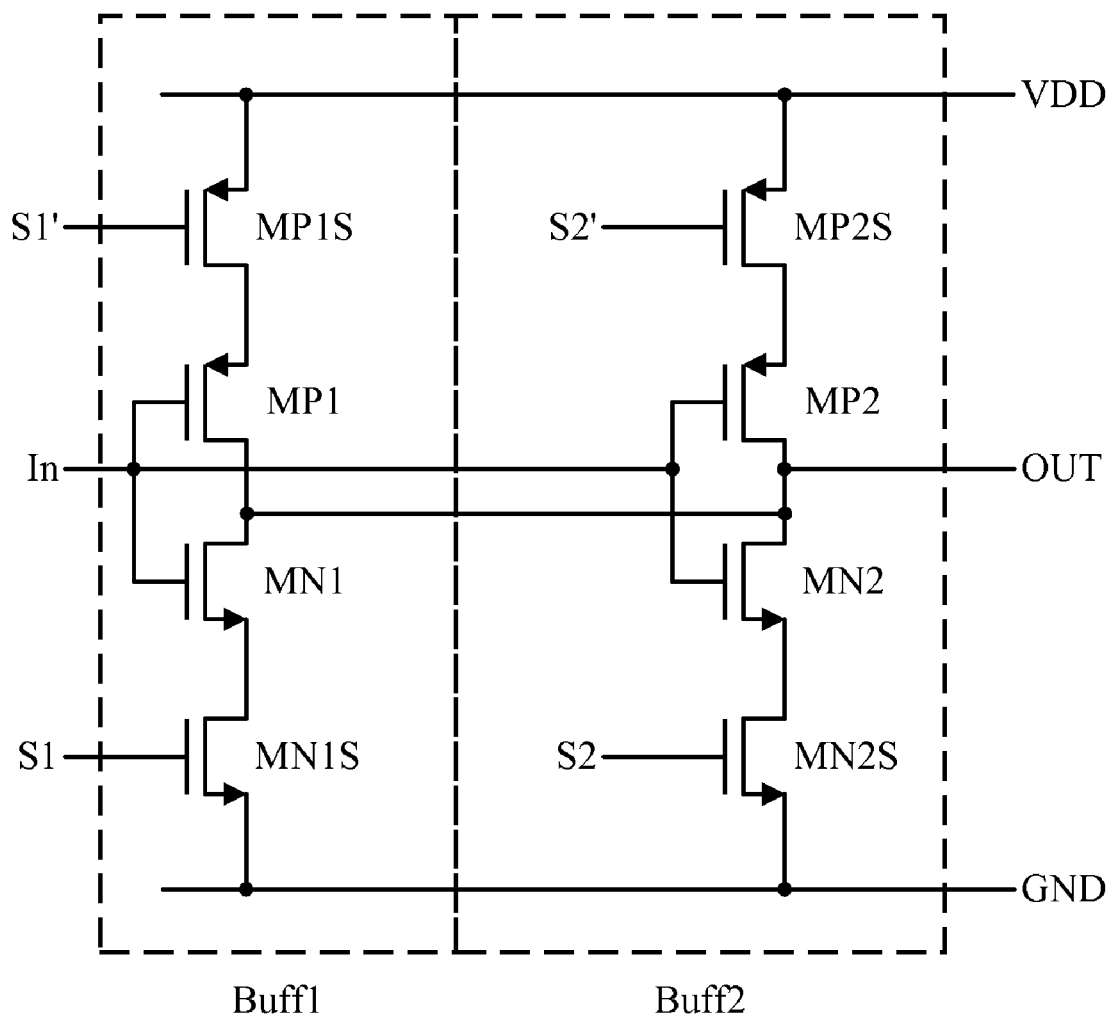
FIG. 6 depicts an embodiment of an LO buffer with adjustable sizes according to the present disclosure.

FIG. 6 depicts an embodiment of an LO buffer with adjustable sizes according to the present disclosure.

In FIG. 6, a first amplifier Buff1 includes active transistors MP1 and MN1 driven by an input signal In. Coupled in series with MN1 and MP1 are switches MN1S and MP1S controlled by S1 and S1', respectively. In an embodiment, S1' is the inverse of S1, i.e., S1' is high when S1 is low, and vice versa. The drains of MN1 and MP1 are coupled to the output signal Out.

A second amplifier Buff2 similarly includes active transistors MP2 and MN2 driven by the input signal In. Coupled in series with MN2 and MP2 are switches MN2S and MP2S controlled by signals S2 and S2', respectively. In an embodiment, S2' is the inverse of S2, i.e., S2' is high when S2 is low, and vice versa. The drains of MN2 and MP2 are also coupled to the output signal Out.

The operation of the circuit in FIG. 6 may be characterized as follows. When S1 is high and S2 is low, then Buff1 is turned on, and Buff2 is turned off. This is because the switches S1 and S1' are turned on, while S2 and S2' are turned off. In this case, the effective size of the LO buffer corresponds to the gate sizes of transistors MP1 and MN1. Similarly, when S2 is high and S1 is low, then Buff2 is turned on, and Buff1 is turned off. In this case, the effective size of the LO buffer corresponds to the gate sizes of transistors MP2 and MN2. Finally, when S1 and S2 are both high, then both Buff1 and Buff2 are turned on. In this case, the effective size of the LO buffer corresponds to the combined gate sizes of MP2 and MP1, and the combined gate sizes of MN2 and MN1.

By configuring the signals S1 and S2, the effective size of the LO buffer is selectable among that of MP1/MN1 (Buff1 turned on), MP2/MN2 (Buff2 turned on), or MP1/MN1/MP2/MN2 (Buff1 and Buff2 turned on). In general, the sizes of the transistors can have any relationship with each other. In an embodiment, MP2 and MN2 are twice as large as MP1 and MN1, respectively.

One of ordinary skill in the art may readily modify the design depicted in FIG. 6 to accommodate more than the two buffers shown, to allow for further configurability using more selectable sizes. Note the control signal provided to the switches, e.g., CL according to FIG. 3, may also be readily modified to accommodate more than two switches. Such embodiments are contemplated to be within the scope of the disclosure.

Figure 7:
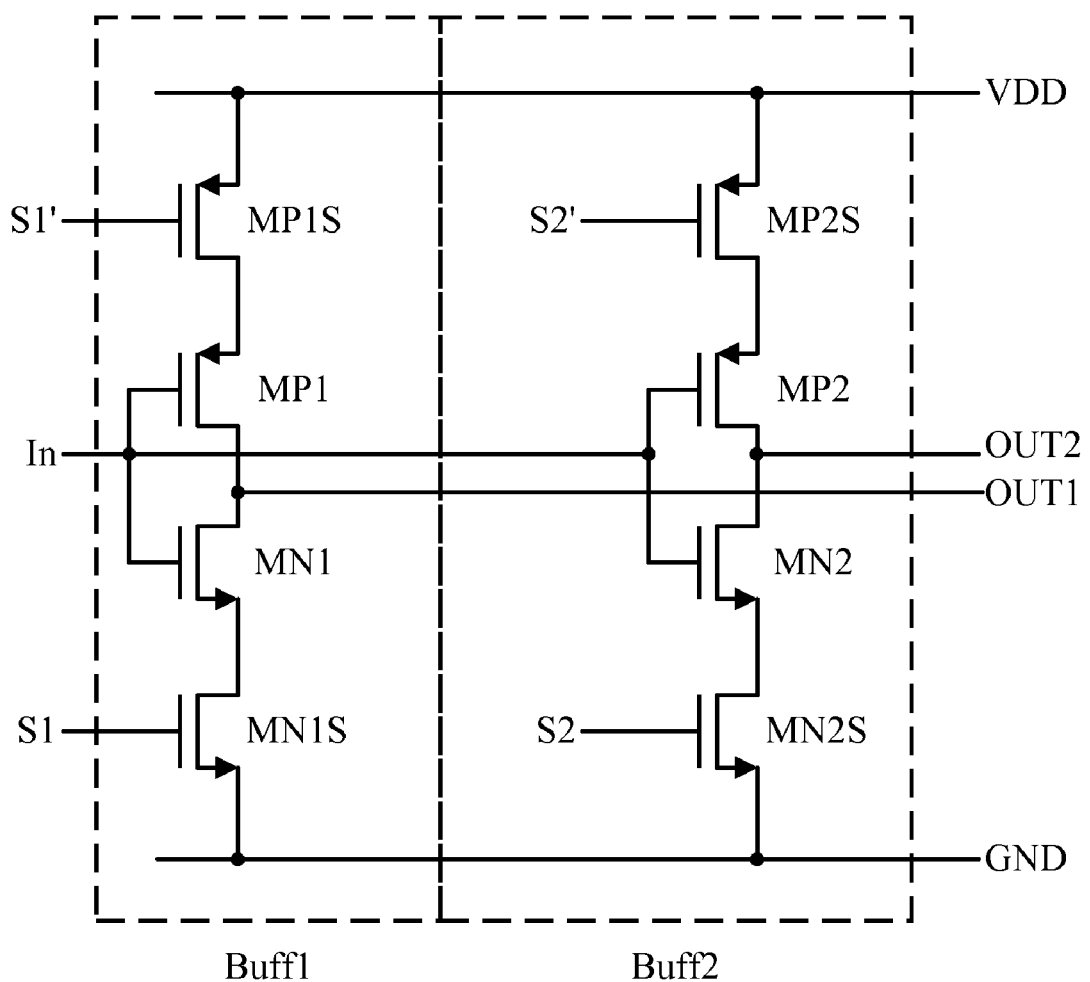
FIG. 7 depicts an embodiment of an LO buffer with an adjustable size, configured to drive separate mixers.

FIG. 7 depicts an embodiment of an LO buffer with an adjustable size, configured to drive separate mixers. The operation of the embodiment in FIG. 7 is identical to that of the embodiment in FIG. 6, except that the output OUT1 of the first buffer Buff1 is kept separate from the output OUT2 of the second buffer Buff2. In this way, Buff1 in Buff2 in FIG. 7 may be employed as LO Buffer 200.1 and LO Buffer 200.2 in FIG. 2, i.e., to drive two separate mixers 202.1 and 202.2.

According to the present disclosure, techniques have been provided for selectable LO buffer and/or mixer sizes in a receiver circuit. Another aspect of the present disclosure provides for selection of LO buffer and/or mixer sizes based on an operating mode of the receiver.

In a typical implementation of the receiver in FIG. 1, the overall gain of the receiver chain may take on a plurality of values depending on the received signal strength. For example, when the received signal strength is high, the receiver chain may be configured to have a low overall gain. Conversely, when the received signal strength is low, the receiver chain may be configured to have a high gain. The gain may be configured by, e.g., programming the gain of the LNA and/or mixer to the desired levels.

According to the present disclosure, the LO buffer and/or mixer sizes may be selected depending on the gain mode of the receiver to minimize the current consumption in such gain mode.

In an embodiment, the LO buffer size may be made a function of the receiver gain mode. The LO buffer size may be increased in response to the receiver being switched from a lower gain to a higher gain mode. Alternatively, the LO buffer size may be decreased in response to the receiver being switched from a lower gain to a higher gain mode.

In an embodiment, the mixer size may also be made a function of the receiver gain mode. The mixer size may be increased in response to the receiver being switched from a lower gain mode to a higher gain mode. Alternatively, the mixer size may be decreased in response to the receiver being switched from a lower gain mode to a higher gain mode.

In an embodiment, when the receiver chain is configured to have a low gain, both the LO buffer and the mixer are configured to a first size. When the receiver chain is configured to have a high gain, both the LO buffer and mixer are configured to a second size larger than the first size. In this embodiment, the better linearity and phase noise characteristics afforded by a larger LO buffer and mixer are made available when receiving weak signals, while the lower current consumption afforded by a smaller LO buffer and mixer is made available when receiving strong signals.

In an embodiment, the circuitry described with reference to FIG. 2 may be employed to make the LO buffer and mixer sizes dependent on receiver gain mode. This can be accomplished by configuring control signals C1 and C2 in FIG. 2 based on the gain mode. In another embodiment, the circuitry described with reference to FIGS. 5 and 6 may be employed by configuring the switches and control signals described with reference thereto based on the receiver gain mode. In yet another embodiment, any circuit topology allowing for selectable size of a buffer and/or mixer may be employed in the configuration of FIG. 3, with control signals CL and/or CM configured to depend on the receiver gain mode.

In an embodiment, in response to the receiver gain mode being adjusted, the sizes of the LO buffer and the mixer can be adjusted in lock-step, i.e., when the size of the LO buffer is decreased, so is the size of the mixer, and vice versa. In an embodiment, any adjustment made to the mixer size is proportional to any adjustment made to the LO buffer size. For example, if the LO buffer size is doubled, so is the mixer size. This ensures that the LO buffer drive capability is matched to the size of the mixer load being driven.

One of ordinary skill in the art will realize that the any number of receiver gain modes greater than two may be associated with a corresponding number of selectable LO buffer and/or mixer sizes. Such embodiments incorporating more than two modes are contemplated to be within the scope of the present disclosure.

Based on the teachings described herein, it should be apparent that an aspect disclosed herein may be implemented independently of any other aspects and that two or more of these aspects may be combined in various ways. The techniques described herein may be implemented in hardware, software, firmware, or any combination thereof. If implemented in hardware, the techniques may be realized using digital hardware, analog hardware or a combination thereof. If implemented in software, the techniques may be realized at least in part by a computer-program product that includes a computer readable medium on which one or more instructions or code is stored.

By way of example, and not limitation, such computer-readable media can comprise RAM, such as synchronous dynamic random access memory (SDRAM), read-only memory (ROM), non-volatile random access memory (NVRAM), ROM, electrically erasable programmable read-only memory (EEPROM), erasable programmable read-only memory (EPROM), FLASH memory, CD-ROM or other optical disk storage, magnetic disk storage or other magnetic storage devices, or any other tangible medium that can be used to carry or store desired program code in the form of instructions or data structures and that can be accessed by a computer.

The instructions or code associated with a computer-readable medium of the computer program product may be executed by a computer, e.g., by one or more processors, such as one or more digital signal processors (DSPs), general purpose microprocessors, ASICs, FPGAs, or other equivalent integrated or discrete logic circuitry.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

A number of aspects and examples have been described. However, various modifications to these examples are possible, and the principles presented herein may be applied to other aspects as well. These and other aspects are within the scope of the following claims.

The invention claimed is:

1. A receiver apparatus comprising:
    a local oscillator (LO) buffer operative to buffer an LO signal to produce a buffered LO signal, the LO buffer having a selectable size, wherein the size of the LO buffer relates to the width of transistors in a signal path of the LO buffer.

2. The apparatus of claim 1, further comprising:
    a mixer operative to mix a radio frequency (RF) signal with the buffered LO signal, the mixer having a selectable size.

3. The apparatus of claim 2, the LO buffer comprising:
    a first buffer having an input coupled to the LO signal and an output coupled to the buffered LO signal; and
    a second buffer having an input coupled to the LO signal and an output coupled to the buffered LO signal.

4. The apparatus of claim 3, the LO buffer further comprising an LO buffer control signal for selectively enabling the first buffer or the second buffer.

5. The apparatus of claim 2, the mixer being a Gilbert multiplier, the buffered LO signal being a differential signal, the mixer comprising:
    a first transistor having a gate coupled to the buffered LO signal, the mixer further comprising a first transistor control signal for turning on and turning off the first transistor; and
    a second transistor having a gate coupled to the buffered LO signal, the mixer further comprising a second transistor control signal for turning on and turning off the second transistor.

6. The apparatus of claim 5, the second transistor having a size twice that of the first transistor.

7. The apparatus of claim 2, further comprising an LO control signal for selecting a size of the LO buffer, the apparatus further comprising a mixer control signal for selecting a size of the mixer.

8. The apparatus of claim 2, the buffered LO signal comprising first and second buffered LO signals, the LO buffer comprising:
    a first buffer having an input coupled to the LO signal and an output coupled to the first buffered LO signal; and
    a second buffer having an input coupled to the LO signal and an output coupled to the second buffered LO signal.

9. The apparatus of claim 8, the second buffer having a size twice that of the first buffer.

10. The apparatus of claim 8, the mixer comprising:
    a first mixer having a first mixer size, the first mixer having an input coupled to the first buffered LO signal; and
    a second mixer having a second mixer size, the second mixer having an input coupled to the second buffered LO signal, the output of the first mixer coupled to the output of the second mixer.

11. The apparatus of claim 10, the second mixer being twice the size of the first mixer.

12. The apparatus of claim 10, further comprising a control signal for selectively enabling:
    1) a first signal path comprising the first buffer and the first mixer, and
    2) a second signal path comprising the second buffer and the second mixer.

13. The apparatus of claim 12, the control signal enabling the first signal path by turning on the first buffer.

14. The apparatus of claim 13, the control signal further enabling the second signal path by turning on the first mixer.

15. The apparatus of claim 2, the receiver capable of operation in a plurality of gain modes, the receiver further comprising an LO control signal selecting a first size for the LO buffer in response to the receiver operating in a low gain mode, the LO control signal further selecting a second size for the LO buffer in response to the receiver operating in a high gain mode, the second size being larger than the first size.

16. The apparatus of claim 15, the receiver further comprising a mixer control signal for selecting a third size for the mixer in response to the receiver operating in a high gain mode, the mixer control signal further selecting a fourth size for the mixer in response to the receiver operating in a low gain mode, the third size larger than the fourth size.

17. The apparatus of claim 2, the receiver further comprising a control signal for selecting, in response to the receiver operating in a low gain mode, a first size for the LO buffer and a second size for the mixer, the control signal further selecting, in response to the receiver operating in a high gain mode, a third size for the LO buffer and a fourth size for the mixer, the third size larger than the first size, and the fourth size larger than the second size.

18. A method for selecting a size of at least one component in a receiver, the receiver comprising an amplifier, a mixer, and a local oscillator (LO) buffer, the method comprising:
    selecting a first mixer size when the amplifier is in a first gain mode; and
    selecting a second mixer size when the amplifier is in a second gain mode, wherein the size of the mixer relates to the width of transistors in a signal path of the mixer.

19. The method of claim 18, the gain of the amplifier higher in the second gain mode than in the first gain mode, and the second mixer size larger than the first mixer size.

20. The method of claim 19, further comprising:
    selecting a first LO buffer size when the amplifier is in the first gain mode; and
    selecting a second LO buffer size when the amplifier is in the second gain mode, the second LO buffer size being larger than the first LO buffer size.

21. The method of claim 20, the selecting a first LO buffer size comprising enabling a first signal path corresponding to a first LO buffer, and the selecting a second LO buffer size comprising enabling a second signal path corresponding to a second LO buffer.

22. The method of claim 20, the selecting a first or second LO buffer size comprising providing an LO buffer control signal to the LO buffer, the LO buffer having a configurable size.

23. The method of claim 20, the selecting a first LO buffer size and the selecting a first mixer size comprising enabling a first signal path, and the selecting a second LO buffer size and the selecting a second mixer size comprising enabling a second signal path.

24. The method of claim 19, the selecting a first mixer size comprising enabling a first transistor of a Gilbert multiplier, the selecting a second mixer size comprising enabling a second transistor of the Gilbert multiplier.

25. The method of claim 19, the selecting a first or second mixer size comprising providing a mixer control signal to the mixer, the mixer having a configurable size.

26. A receiver apparatus comprising:
    means for providing a mixer having a selectable size;
    means for providing a local oscillator (LO) buffer having a selectable size; and
    means for selecting a first mixer size and a first local oscillator (LO) buffer size when the receiver is in a first gain mode, and for selecting a second mixer size and a second local oscillator (LO) buffer size when the receiver is in a second gain mode, wherein the size of the LO buffer relates to the width of transistors in a signal path of the LO buffer.

27. The apparatus of claim 26, further comprising means for providing a mixer control signal to the mixer.

28. The apparatus of claim 27, said means for providing a mixer control signal to the mixer further providing an LO buffer control signal to the LO buffer.

29. An apparatus for selecting a size of at least one component in a receiver, the receiver comprising an amplifier, a mixer, and a local oscillator (LO) buffer, the apparatus comprising:
    means for selecting a first mixer size when the amplifier is in a first gain mode, and selecting a second mixer size when the amplifier is in a second gain mode, wherein the size of the mixer relates to the width of transistors in a signal path of the mixer.

30. The apparatus of claim 29, further comprising:
    means for selecting a first LO buffer size when the amplifier is in the first gain mode, and selecting a second LO buffer size when the amplifier is in the second gain mode.

31. The apparatus of claim 30, the second LO buffer size being larger than the first LO buffer size.

32. The apparatus of claim 29, the gain of the amplifier higher in the second gain mode than in the first gain mode, and the second mixer size larger than the first mixer size.

* * * * *